United States Patent [19]

Itoh

[11] 4,044,340
[45] Aug. 23, 1977

[54] SEMICONDUCTOR MEMORY

[75] Inventor: Kiyoo Itoh, Higashi-kurume, Japan

[73] Assignee: Hitachi, Ltd., Japan

[21] Appl. No.: 645,306

[22] Filed: Dec. 29, 1975

[30] Foreign Application Priority Data

Dec. 25, 1974 Japan .............................. 49-148056

[51] Int. Cl.² ............................................. G11C 11/40
[52] U.S. Cl. ........................ 340/173 R; 340/173 SP; 340/173 CA; 307/238; 307/279
[58] Field of Search .................. 340/173 SP, 173 CA, 340/173 R

[56] References Cited
U.S. PATENT DOCUMENTS 3,183,490  5/1965  Cubbage ..................... 340/173 SP
3,383,663  5/1968  David ........................... 340/173 SP
3,506,969  4/1970  Abbas .......................... 340/173 CA Primary Examiner—Terrell W. Fears
Attorney, Agent, or Firm—Craig & Antonelli

[57] ABSTRACT

A random access type semiconductor memory comprises a pair of data line halves arranged in parallel, a plurality of word lines orthogonal to the data line halves, a multiplicity of memory cells, each of which is arranged at either one of the cross points between the data line halves and each of the word lines, a differential amplifier to which signals on the data line halves are differentially applied, and a main amplifier to which output signals on the data line halves are differentially applied, thereby detecting the content of a desired memory cell.

17 Claims, 9 Drawing Figures

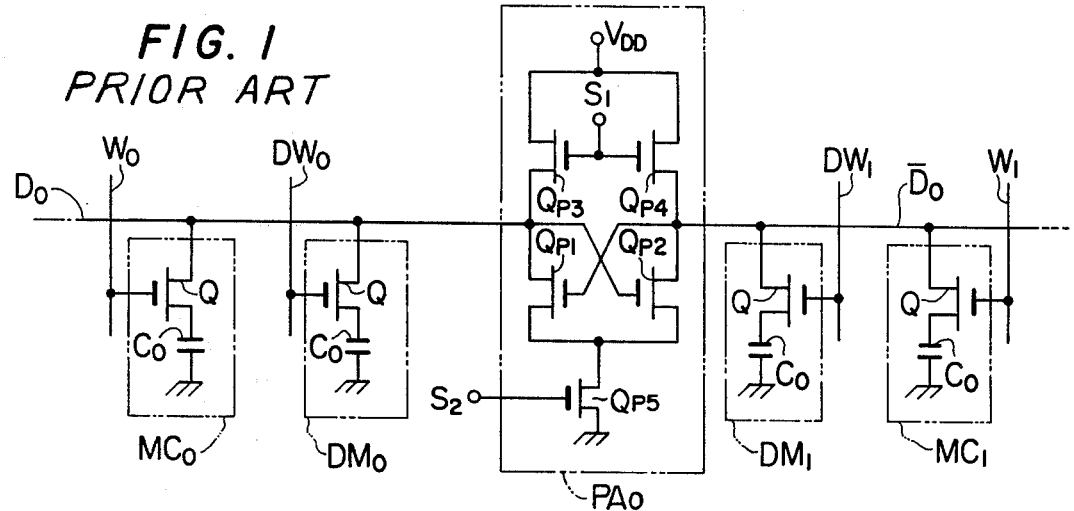
FIG. 1 PRIOR ART
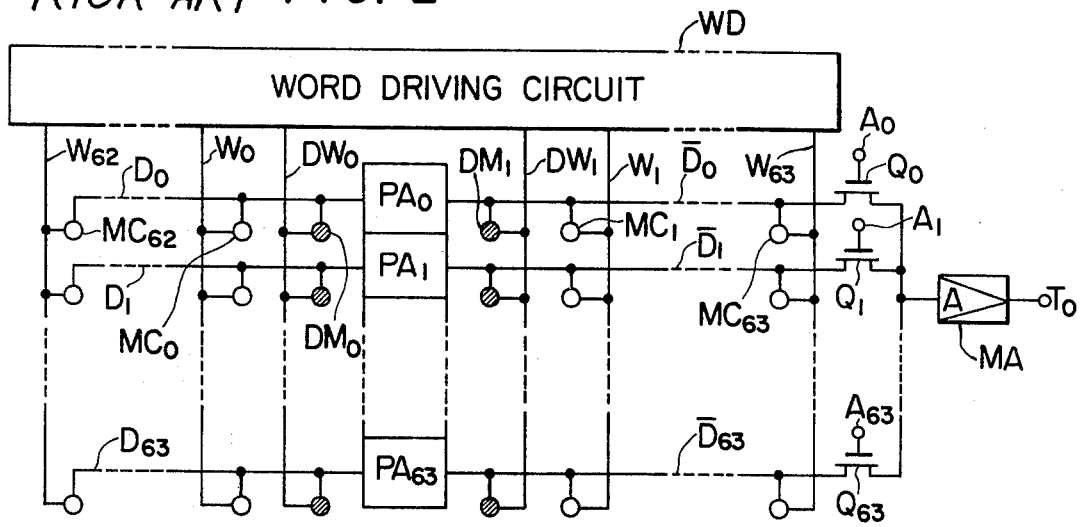
PRIOR ART FIG. 2
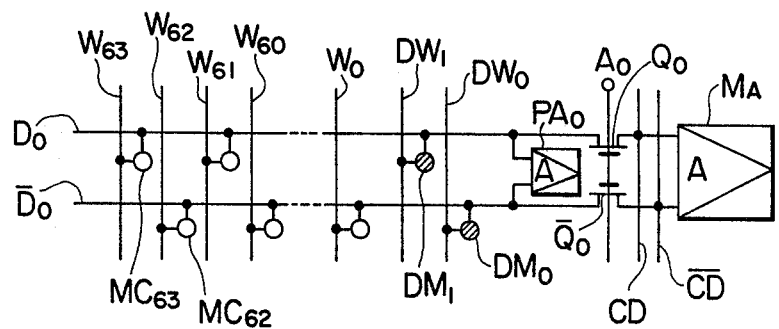
FIG. 3

FIG. 4a
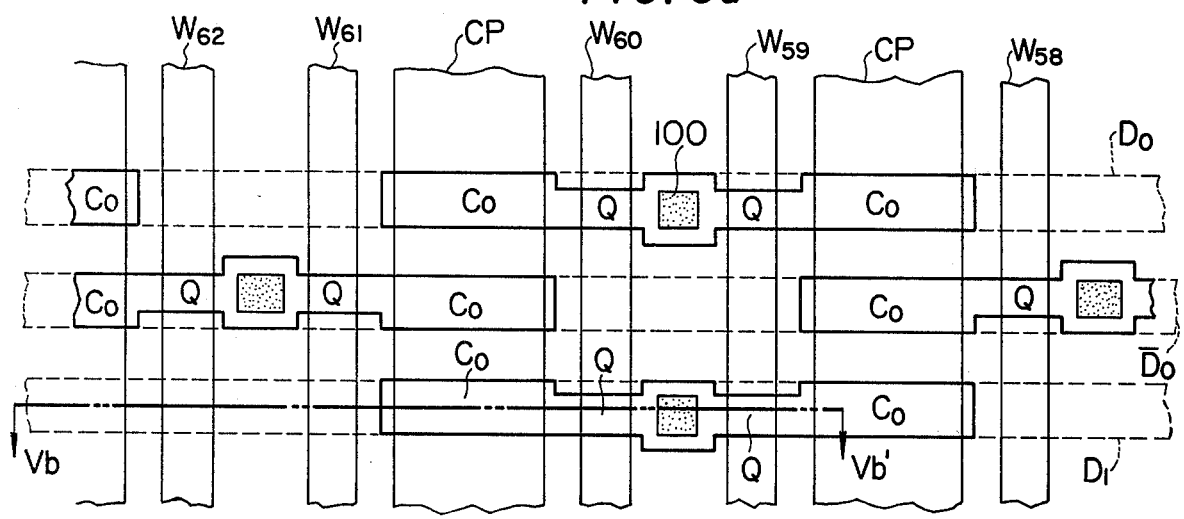
FIG. 4b
FIG. 4c
FIG. 5a
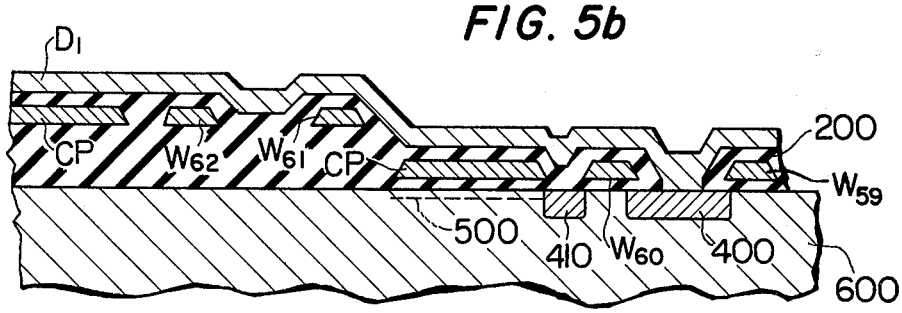
FIG. 5b
FIG. 6
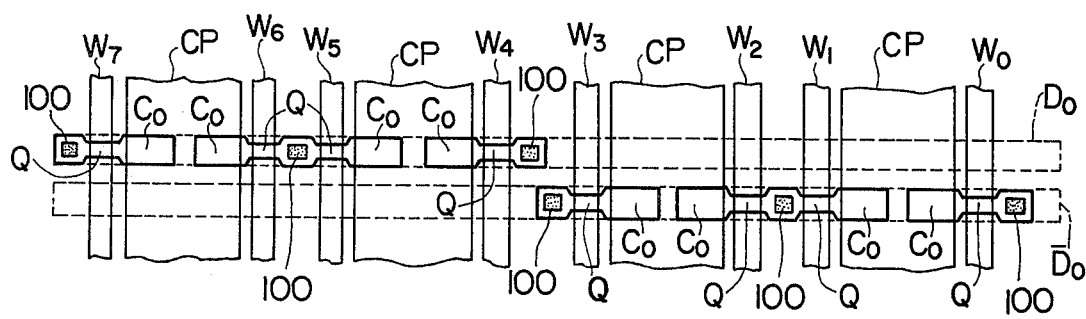

SEMICONDUCTOR MEMORY

BACKGROUND OF THE INVENTION

1. Field of the Invention

This invention relates to a random access type memory arrangement for a semiconductor memory.

2. Description of the Prior Art

In a prior art random access type semiconductor memory, a data line is divided into two halves, each of which has a plurality of memory cells and a dummy cell, and a differential amplifier is connected between the left half and the right half of the data line. The contents of a desired memory cell connected to one data line half are read out and, at the same time, the contents of a dummy cell connected to the other data line half are also read out. The voltage on either one of the data line halves is detected through a switching element.

However, such a prior art memory has the following disadvantages.

Since only the voltage on one of the digit line halves is detected, it is impossible to read out the data at a high speed and there is the possibility of erroneously detecting the contents of a memory cell due to an electrical imbalance of the data line halves.

Since the data line halves are not geometrically adjacent each other, unbalanced noise signals are produced on the data line halves, thereby causing the differential amplifier to operate erroneously.

SUMMARY OF THE INVENTION

An object of the invention is to provide a random access type semiconductor memory which can operate at a high speed and at a stable condition.

In order to attain such an object, this invention is characterized by arranging the data line halves so as to be adjacent each other.

BRIEF DESCRIPTION OF THE DRAWINGS

FIG. 1 is a diagram showing part of a circuit construction of a prior art memory.

FIG. 2 is a diagram showing the entire circuit construction of a prior art memory.

FIG. 3 is a diagram showing an embodiment of a semiconductor memory according to this invention.

FIGS. 4a to 4c are diagrams showing various embodiments of a memory cell arrangement according to this invention.

FIGS. 5a and 5b are respective plane and sectional views showing an embodiment of memory arrangement according to this invention.

FIG. 6 is a plane view showing another embodiment of memory arrangement according to this invention.

DETAILED DESCRIPTION OF THE PRIOR ART

At least one memory cell $MC_0$ and a dummy memory cell $DM_0$ are connected to the left half $D_0$ of a data line and at least one memory cell $MC_1$ and a dummy memory cell $DM_1$ are connected to the right half $\bar{D}_0$ of a data line. These data line halves $D_0$ and $\bar{D}_0$ are connected to a pre-amplifier $PA_0$ using a differential amplifier.

Each of the memory cells $MC_0$, $MC_1$, $DM_0$ and $DM_1$ comprises a MOS (metal-oxide-semiconductor) transistor Q and a capacitor $C_0$. The gates of the MOS transistors Q in the memory cells $MC_0$ and $DM_0$ are connected to word lines $W_0$ and $DW_0$ which are orthogonal to data line half $D_0$. The gates of the MOS transistors Q in memory cells $MC_1$ and $DM_1$ are connected to word lines $W_1$ and $DW_1$ which are orthogonal to data line half $\bar{D}_0$. The drains of MOS transistors Q in memory cells $MC_0$, $DM_0$ and $CM_0$, $DM_1$ are connected to data line halves $D_0$ and $\bar{D}_0$, respectively. The capacitors $C_0$ in the respective memory cells are connected between the sources of the respective transistors Q and ground.

The preamplifier $PA_0$ has a pair of cross-coupled MOS transistors $Q_{P1}$ and $Q_{P2}$ connected between the data line halves $D_0$ and $\bar{D}_0$ and MOS transistors $Q_{P3}$ to $Q_{P5}$. The drains and gates of MOS transistors $Q_{P3}$ and $Q_{P4}$ are connected to a power supply terminal $V_{DD}$ and a set signal terminal $S_1$, respectively, and the sources thereof are connected to the drains of MOS transistors $Q_{P1}$ and $Q_{P2}$. The gate and source of MOS transistor $Q_{P5}$ are connected to a set signal terminal $S_2$ and ground, respectively, and the drain thereof is connected to the sources of MOS transistors $Q_{P1}$ and $Q_{P2}$.

In operation, where the contents of memory cell $MC_0$ connected to data line half $D_0$ are read out, pulses are applied to the corresponding work line $W_0$ and dummy word line $DW_1$ orthogonal to data line half $\bar{D}_0$. Small signals on the data line halves $D_0$ and $\bar{D}_0$ which have different valves with respect to each other are applied to the pre-amplifier $PA_0$. The small signals are amplified by the pre-amplifier $PA_0$ when the set signal is applied to terminals $S_1$ and $S_2$.

Furthermore, an amplified signal on one of the data line halves $D_0$ and $\bar{D}_0$ is detected, thereby detecting the information ("1" or "0") of a desired memory cell $MC_0$.

In detail, the voltage across capacitor $C_0$ in dummy cell $DM_1$ is a voltage intermediate an information "1" voltage and an information "0" voltage across capacitor $C_0$ in memory cell $MC_0$. Therefore, signal read out from dummy cell $DM_1$ to data line half $\bar{D}_0$ has a value intermediate information "1" and "0" signals read out from memory cell $MC_1$ to data line half $D_0$. Output signals which are of different polarities with respect to each other are obtained by the pre-amplifier $PA_0$ in response to the difference between signals on the data line halves $D_0$ and $\bar{D}_0$.

FIG. 2 shows a circuit of a large scale integrated (LSI) memory which employs the random access type memory circuit shown in FIG. 1.

In FIG. 2, $MC_0$ to $MC_{63}$ represent memory cells, $DM_0$ and $DM_1$ dummy cells, $W_0$ to $W_{63}$ and $DW_0$ and $DW_1$ word lines, $D_0$ to $D_{63}$ and $\bar{D}_0$ to $\bar{D}_{63}$ data line halves, $A_0$ to $A_{63}$ address signal terminals, MA a main amplifier, $T_0$ an output terminal, $Q_0$ to $Q_{63}$ MOS transistors and WD a word driving circuit.

In order to detect signals on data line halves $\bar{D}_0$ to $\bar{D}_{63}$, address signals $A_0$ to $A_{63}$ are selectively applied to the gates of MOS transistors $Q_0$ to $Q_{63}$. For example, when a signal on data line half $\bar{D}_0$ is detected, MOS transistor $Q_0$ is made conductive by a signal from terminal $A_0$. Therefore, a signal on data line half $\bar{D}_0$ is applied to the main amplifier MA and an amplified signal is derived from the output terminal $T_0$.

The contents of the memory cells $MC_0$ to $MC_{63}$ are read out by word signals on the word lines $W_0$ to $W_{63}$. At the same time, the contents of dummy cell $DM_0$ or $DM_1$ are read out by a word signal on word line $DW_0$ or $DW_1$. These word signals are supplied from the word driving circuit WD. For example, when the information stored in memory cell $MC_{62}$ is read out, word signals are applied to word lines $W_{62}$ and $DW_1$.

The prior art memory shown in FIGS. 1 and 2 has the following disadvantages.

1. Since only a signal on either one of data line halves $D_0$ and $\bar{D}_0$ is amplified by the main amplifier MA, it is impossible to detect the contents of a desired memory cell at a high speed.

2. There is the possibility of erroneously detecting the contents of a desired memory cell by an electrical imbalance of data line halves $D_0$ and $\bar{D}_0$.

3. Since the data line halves $D_0$ and $\bar{D}_0$ are geometrically separated from each other, unbalanced noise signals are produced on the data line halves $D_0$ and $\bar{D}_0$. Therefore, there is the possibility that the pre-amplifier $PA_0$ will operate erroneously.

DETAILED DESCRIPTION OF THE INVENTION

FIG. 3 shows an embodiment of circuit construction of a semiconductor memory random access type according to this invention.

In FIG. 3, a pair of data line halves $D_0$ and $\bar{D}_0$ are arranged at adjacent positions and in parallel.

Each of the memory cells $MC_0$ to $MC_{63}$ is connected between one of the word lines $W_0$ to $W_{63}$ which are orthogonal to the data line halves $D_0$ and $\bar{D}_0$ and one of the data line halves $D_0$ and $\bar{D}_0$. That is, a memory cell is connected to only one of the cross points between each of the word lines $W_0$ to $W_{63}$ and the data line halves. Memory cells $MC_1$ to $MC_{62}$ (even number) are connected between word lines $W_0$ to $W_{62}$ (even number) and data line half $\bar{D}_0$ and memory cell $MC_1$ to $MC_{63}$ (odd number) are connected between word lines $W_1$ to $W_{63}$ (odd number) and data line half $D_0$. Furthermore, a dummy memory cell $DM_0$ is connected between a word line $DW_0$ and data line half $\bar{D}_0$ and a dummy memory cell $DM_1$ is connected between a word line $DW_1$ and data line half $D_0$. The data line halves $D_0$ and $\bar{D}_0$ are connected to a pre-amplifier, such as $PA_0$ shown in FIG. 1 and are further connected to the main amplifier MA through MOS transistors $Q_0$ and $\bar{Q}_0$, respectively. An address signal from terminal $A_0$ is applied to MOS transistors $Q_0$ and $\bar{Q}_0$.

Signals on other data line halves connected in common to common data lines CD and $\overline{CD}$ are also applied to the main amplifier MA.

When the contents of a desired memory cell, for example, $MC_{63}$, are read out, word signals are applied to memory cell $MC_{63}$ and dummy cell $DM_0$ which is connected to data line half $\bar{D}_0$. Signals on the data line halves $D_0$ and $\bar{D}_0$ are applied to the pre-amplifier $PA_0$. Signals amplified differentially by the pre-amplifier $PA_0$ are applied through transistors $Q_0$ and $\bar{Q}_0$ to the main amplifier MA using a differential amplifier at the application of the address signal from terminal $A_0$. A signal amplified differentially by the main amplifier MA is derived from the output terminal $T_0$.

Since a pair of data line halves $D_0$ and $\bar{D}_0$ are arranged in parallel and both signals on the data line halves $D_0$ and $\bar{D}_0$ are applied through MOS transistors $Q_0$ and $\bar{Q}_0$ to the main amplifier MA, it is possible to maintain an electrical balance of the data line halves $D_0$ and $\bar{D}_0$.

FIGS. 4a to 4c show various embodiments of a random access type memory cell arrangement according to this invention.

In these figures, a circle represents the presence of a memory cell and an X represents the absence of a memory cell. Memory cells are arranged alternately one by one on the data line halves $D_0$ and $\bar{D}_0$ in FIG. 4a. Memory cells are arranged alternately in pairs on the data line halves $D_0$ and $\bar{D}_0$ in FIG. 4b. Furthermore, memory cells are arranged alternately in fours on the data line halves $D_0$ and $\bar{D}_0$ in FIG. 4c.

FIG. 5a shows a plane view of an embodiment of a random access type memory arrangement according to the invention for realizing the memory arrangement shown in FIG. 4b by means of a silicon gate.

FIG. 5b shows a sectional view along line $Vb$-$Vb'$ in FIG. 5a. In these figures, CP represents a storage capacitor forming electrode for forming storage capacitors $C_0$ in the memory cells. 400 and 410 represent the drain and source (or source and drain) of transistor Q shown in FIG. 1, which are formed in a silicon substrate 600.

100 represents a contact part between the data line halves $D_0$, $\bar{D}_0$, etc., and a diffusion layer 400 forming a drain (or source). 200 represents an insulating layer for separating word line $W_{59}$ from data line half $D_1$.

Electrodes CP and word lines $W_{58}$, $W_{59}$, etc. are formed of polysilicon and data line halves $D_0$, $\bar{D}_0$, etc. are formed of aluminum.

In a N-channel MOS, the storage capacitor $C_0$ is formed between a channel 500 and an electrode CP when a high voltage is applied to the electrode CP.

In such an arrangement, when pulse voltages are applied to a word line, for example, $W_{60}$, transistor Q comprising drain 400 and source 410 connected to the cross point between word line $W_{60}$ and data line half $D_0$ is made conductive. Therefore, the storing voltage of the storage capacitor $C_0$ beneath the data line half $D_0$ is read out so that this voltage is divided by the capacitance of the data line half $D_0$ and the storage capacitor $C_0$. The storing voltage of the storage capacitor $C_0$ beneath the data line half $\bar{D}_0$ is not read out, since there is no transistor connected to the cross point between word line $W_{60}$ and data line half $\bar{D}_0$. The voltage from a dummy cell (not shown in the figure) is present on data line half $\bar{D}_0$.

FIG. 6 shows a plane view of another embodiment of a random access type memory arrangement according to this invention for realizing the memory arrangement in FIG. 4c by means of a silicon gate.

Since the construction and operation of a random access type memory arrangement shown in FIG. 6 are similar to those of memory arrangement shown in FIG. 5a except that memory cells are arranged alternately four by four on the data line halves $D_0$ and $\bar{D}_0$, a detailed description thereof will be omitted.

In these embodiments, it is also possible to use aluminum in lieu of polysilicon as the word lines.

According to the memory arrangement of the invention shown in FIGS. 3 and 4, the following advantages are obtained.

1. Since both signals on the data line halves $D_0$ and $\bar{D}_0$ are differentially applied through MOS transistors $Q_0$ and $\bar{Q}_0$ to the main amplifier, it is possible to detect the contents of a desired memory cell at a high speed.

2. Since there is no electrical imbalance of the data line halves $D_0$ and $\bar{D}_0$, the contents of a desired memory cell are correctly detected.

3. Since the data line halves $D_0$ and $\bar{D}_0$ are geometrically adjacent each other, no imbalance noise signals are produced on the data line halves $D_0$ and $\bar{D}_0$. Therefore, the pre-amplifier MA operates correctly.

4. In the prior art memory shown in FIGS. 1 and 2, the pre-amplifier $PA_0$, which has an area far greater than that of a memory cell, must be arranged between the data line halves $D_0$ and $\bar{D}_0$. Therefore, it is difficult to arrange such a pre-amplifier so as to maintain a desired pitch of a data line. However, in a memory of the invention shown in FIG. 3, since a pair of data line halves $D_0$ and $\overline{D}_0$ are arranged in parallel on one side of pre-amplifier $PA_0$, such a pre-amplifier can be arranged so as to maintain a desired pitch of a data line.

In FIG. 3, the pre-amplifier $PA_0$ may be arranged between MOS transistors $Q_0$ and $\overline{Q}_0$ and the main amplifier MA. Furthermore, it can be arranged on the left terminal side, that is, the word line $W_{63}$ side. In such a case, it is possible to obviate the concentration of the control circuits ($PA_0$, $Q_0$, etc.), which arrangement is relatively difficult, on one side.

If necessary, the pre-amplifiers, which are provided for every pair of data line halves, may be arranged alternately on one side and the other sides.

Thus, it is possible to remarkably increase the freedom of the memory arrangement.

In FIG. 3, various differential amplifiers can be used as the pre-amplifier $PA_0$. Each of the memory cells $MC_0$ to $MC_{63}$, $DM_0$ and $DM_1$ can be constituted by a memory cell of various types in lieu of a circuit shown in FIG. 1.

Furthermore, according to the invention, dummy memory cells $DM_0$ and $DM_1$ can be eliminated since the data line halves $D_0$ and $\overline{D}_0$ are arranged in parallel.

I claim:

1. A semiconductor memory comprising:
   at least a pair of data line portions arranged in parallel with each other and at positions adjacent to each other;
   a plurality of first word lines orthogonally crossing over said data line portions;
   a multiplicity of memory cells, each of which is coupled to a respective data line portion and a respective first word line at the cross point thereof and can perform random access for write-in and read-out of data;
   a differential amplifier to which signals on said pair of data line portions are respectively applied; and
   means, connected to said differential amplifier and said data line portions, for deriving output signals representative of signals on said pair of data line portions.

2. A semiconductor memory according to claim 1, further comprising,
   a pair of second word lines orthogonally crossing over said data line portions;
   a first dummy memory cell coupled to one of the data line portions of said pair of data line portions and one of said second word lines at the cross point thereof, and
   a second dummy memory cell coupled to the other of the data line portions of said pair of data line portions and the other of said second word lines at the cross point thereof.

3. A semiconductor memory according to claim 1, wherein said output signal deriving means comprises
   a pair of switching elements connected to said data line portions and
   a second differential amplifier connected to said pair of switching elements, to which the signals on said data line portions are selectively applied through said pair of switching elements 4. A semiconductor memory according to claim 3, wherein said switching elements comprise a pair of transistors, each having an input terminal connected to a respective data line portion, an output terminal connected to said second differential amplifier, and a control terminal to which a control signal is applied.

5. A semiconductor memory according to claim 1, wherein each of said memory cells comprises a metal-oxide-semiconductor transistor and a storage capacitor connected therewith.

6. A semiconductor memory according to claim 1, wherein, for each of said data line portions, the memory cells coupled thereto are coupled, alternately, to every other word line.

7. A semiconductor memory according to claim 1, wherein, for each of said data line portions, the memory cells coupled thereto are coupled in alternate pairs of adjacent word lines.

8. A semiconductor memory according to claim 1, wherein for each of said data line portions, the memory cells coupled thereto are coupled in alternate groups of four of adjacent word lines.

9. A semiconductor memory according to claim 1, wherein said memory cells are coupled to said data line portions and said word lines so that the electrical characteristics of said data line portions are balanced with respect to each other.

10. A semiconductor memory according to claim 1, wherein the number of memory cells connected to one of the data line portions of said pair of data line portions is equal to the number of memory cells connected to the other of the data line portions of said pair of data line portions.

11. A semiconductor memory according to claim 3, further comprising
    a pair of second word lines orthogonally crossing over said data line portions;
    a first dummy memory cell coupled to one of the data line portions of said pair of data line portions and one of said second word lines at the cross point thereof; and
    a second dummy memory cell coupled to the other of the data line portions of said pair of data line portions and the other of said second word lines at the cross point thereof.

12. A semiconductor memory according to claim 11, wherein said switching elements comprise a pair of transistors, each having an input terminal connected to a respective data line portion, an output terminal connected to said second differential amplifier, and a control terminal to which a control signal is applied.

13. A semiconductor memory according to claim 1, wherein said data line portions are formed of aluminum and said first word lines are formed of polysilicon.

14. A random access semiconductor memory comprising:
    first and second data line portions disposed parallel and adjacent to each other
    a plurality of first word lines orthogonally crossing over each of said data line portions;
    a plurality of memory cells, disposed at the cross points of said first word lines and one of said data line portions, each of which memory cells is capable of storing selected information to be written therein and is capable of reading out information stored therein, each memory cell having an address terminal connected to a respective word line so that each word line is connected to the address terminal of only one memory cell, and having a data terminal connected to one of said data line portions;
    a differential amplifier connected to each of said data line portions for differentially amplifying signals supplied thereby;

means, connected to said differential amplifier and said data line portions, for deriving output signals representative of signals on said pair of data line portions;

a pair of second word lines orthogonally crossing over each of said data line portions;

a first dummy memory cell, disposed at the crosspoint of one of said second word lines and said first data line, and being capable of storing selected information to be written therein, and being capable of reading out information stored therein, and having an address terminal connected to said one of said second word lines, and having a data terminal connected to said first data line portion; and a second dummy memory cell, disposed at the crosspoint of the other of said second word lines and said second data line, and being capable of storing selected information to be written therein, and being capable of reading out information stored therein, and having an address terminal connected to said other of said second word lines, and having a data terminal connected to said second data line portion.

15. A random access semiconductor memory according to claim 14, wherein said output signal deriving means comprises a pair of switching elements connected to said data line portions and a second differential amplifier connected to said pair of switching elements, to which the signals on said data line portions are selectively applied through said pair of switching elements.

16. A semiconductor memory according to claim 15, wherein each of said memory cells comprises a metal-oxide-semiconductor transistor and a storage capacitor connected therewith.

17. A semiconductor memory according to claim 16, wherein said switching elements comprise a pair of transistors, each having an input terminal connected to a respective data line portion, an output terminal connected to said second differential amplifier, and a control terminal to which a control signal is applied.

* * * * *